United States Patent
Ishikawa

(10) Patent No.: US 10,553,568 B2
(45) Date of Patent: Feb. 4, 2020

(54) LIGHT EMITTING DEVICE

(71) Applicant: NICHIA CORPORATION, Anan-shi, Tokushima (JP)

(72) Inventor: Tetsuya Ishikawa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/081,359

(22) Filed: Mar. 25, 2016

(65) Prior Publication Data

US 2016/0284959 A1    Sep. 29, 2016

(30) Foreign Application Priority Data

Mar. 26, 2015    (JP) .................... 2015-065262

(51) Int. Cl.
| | | |
|---|---|---|
| *H01L 25/075* | (2006.01) | |
| *H01L 33/48* | (2010.01) | |
| *H01L 33/50* | (2010.01) | |

(52) U.S. Cl.
CPC ........ *H01L 25/0753* (2013.01); *H01L 33/486* (2013.01); *H01L 33/504* (2013.01); *H01L 2224/45144* (2013.01); *H01L 2224/48137* (2013.01); *H01L 2224/48247* (2013.01); *H01L 2224/48257* (2013.01); *H01L 2924/181* (2013.01)

(58) Field of Classification Search
CPC ....... H01L 25/0753; H01L 2224/48137; H01L 33/486
See application file for complete search history.

(56) References Cited

U.S. PATENT DOCUMENTS

| | | | | |
|---|---|---|---|---|
| 7,932,525 | B2* | 4/2011 | Osamu | H01L 33/486 250/552 |
| 8,324,654 | B2* | 12/2012 | An | H01L 33/08 257/100 |
| 8,698,187 | B2* | 4/2014 | Kokubu | H01L 33/62 257/666 |
| 2006/0001055 | A1 | 1/2006 | Ueno et al. | |
| 2007/0247841 | A1 | 10/2007 | Kono et al. | |
| 2008/0037252 | A1 | 2/2008 | Nii et al. | |
| 2008/0048193 | A1* | 2/2008 | Yoo | H01L 25/0753 257/89 |
| 2010/0213499 | A1* | 8/2010 | Yamamoto | H01L 25/167 257/99 |

(Continued)

FOREIGN PATENT DOCUMENTS

| | | |
|---|---|---|
| JP | S57-12769 U | 1/1982 |
| JP | S57-128085 A | 8/1982 |

(Continued)

*Primary Examiner* — Tuan A Hoang
(74) *Attorney, Agent, or Firm* — Foley & Lardner LLP

(57) ABSTRACT

A light emitting device of a side-surface light emission type includes a package defining a recess and having a shape elongated in a lateral direction, the package including a pair of lead electrodes arranged next to each other in the lateral direction and forming main portions of a bottom of the recess, and a molded body integrally formed with the pair of lead electrodes and defining sidewalls of the recess, and a light emitting element disposed on at least one of the pair of lead electrodes at the bottom of the recess. The molded body has a reinforcing portion connecting between two sidewalls of the recess opposite to each other in a longitudinal direction. The reinforcing portion is made of two end portions respectively connected to the two sidewalls, and an intermediate portion provided between the two end portions.

21 Claims, 6 Drawing Sheets

(56) References Cited

U.S. PATENT DOCUMENTS

| | | |
|---|---|---|
| 2011/0175127 A1 | 7/2011 | Kanada et al. |
| 2011/0215349 A1 | 9/2011 | An et al. |
| 2012/0080711 A1 | 4/2012 | Kokubu et al. |
| 2013/0087817 A1 | 4/2013 | An et al. |
| 2013/0193460 A1* | 8/2013 | Kanada .................. H01L 33/62 257/88 |
| 2013/0241396 A1 | 9/2013 | Hiramatsu et al. |
| 2013/0261243 A1* | 10/2013 | Nagaoka ............... C08F 283/01 524/399 |
| 2015/0129295 A1* | 5/2015 | Li ........................... H01L 33/62 174/261 |
| 2015/0221836 A1* | 8/2015 | Kurino .................. H01L 33/501 257/98 |

FOREIGN PATENT DOCUMENTS

| | | | | |
|---|---|---|---|---|
| JP | 2005-277380 A | | | 10/2005 |
| JP | 2007-311736 A | | | 11/2007 |
| JP | 2008-041917 A | | | 2/2008 |
| JP | 2008-153610 A | | | 7/2008 |
| JP | 2008153610 A | | * | 7/2008 |
| JP | 2008-294071 A | | | 12/2008 |
| JP | 2009-170795 A | | | 7/2009 |
| JP | 2010-034295 A | | | 2/2010 |
| JP | 2010-129985 A | | | 6/2010 |
| JP | 2010-226091 A | | | 10/2010 |
| JP | 2011-029497 A | | | 2/2011 |
| JP | 2011029497 A | | * | 2/2011 |
| JP | 2011-029497 A | | * | 10/2011 |
| JP | 2011-249807 A | | | 12/2011 |
| JP | 2012-79723 A | | | 4/2012 |
| JP | 2012-231111 A | | | 11/2012 |
| JP | 2013-179273 A | | | 9/2013 |
| JP | 2013-189588 A | | | 9/2013 |
| JP | 5308601 B1 | | | 10/2013 |
| JP | 2014-45140 A | | | 3/2014 |

* cited by examiner

LIGHT EMITTING DEVICE

CROSS-REFERENCE TO RELATED APPLICATION

This application claims priority to Japanese Patent Application No. 2015-065262 filed on Mar. 26, 2015. The entire disclosure of Japanese Patent Application No. 2015-065262 is hereby incorporated herein by reference.

BACKGROUND OF THE INVENTION

1. Technical Field

The present disclosure relates to a light emitting device.

2. Description of Related Art

For example, JP 2009-170795 A discloses a casing made of a resin member that is formed with a recess defined by a bottom portion where a light emitting element is disposed, a pair of first walls facing each other and extending in a first direction, and a pair of second walls facing each other and extending in a second direction with a thickness greater than that of the first walls. In the casing, a planar connecting wall portion perpendicular to the bottom portion that connects the pair of the first walls is provided on the bottom portion of the recess, so that deformation of the casing caused by thermal expansion of a sealing resin disposed in the recess can be reduced.

Further, for example, JP 2011-249807 A discloses a light emitting device (a "light emitting element" in JP 2011-249807 A) including: a body having a recess; a barrier section protruding from a bottom surface of the recess and dividing the bottom surface of the recess into a plurality of portions; a plurality of light emitting diodes including a first light emitting diode disposed at a first region of the bottom surface of the recess and a second light emitting diode disposed at a second region of the bottom surface of the recess; a plurality of lead electrodes spaced apart from each other in the recess and selectively coupled to the plurality of light emitting diodes; wires connecting the plurality of lead electrodes to the plurality of light emitting diodes; a resin layer formed inside the recess; and at least one recess formed at the barrier section. The recess has a height lower than an upper surface of the barrier section and higher than the bottom surface of the recess and the wires are disposed in the recess to connect the lead electrodes to the light emitting diodes disposed in opposite to each other. The height of the recess at the barrier section is formed higher than a thickness of the first and second light emitting diodes with reference to the bottom surface of the recess.

However, with such a connecting wall part (the barrier section) of the conventional light emitting devices, deformation of the casing (the body) may be reduced, but the light of the light emitting element may be blocked and that may affect light distribution of the light emitting device.

SUMMARY

Accordingly, the present invention is devised in view of such circumstances, and an objective thereof is to provide a light emitting device that includes a package having a structure less likely to affect the light distribution of the light emitting device and with which deformation can be reduced.

In order to address the problems described above, a light emitting device according to certain embodiments of the present disclosure includes:
a package defining a recess and having a shape elongated in a lateral direction, the package including a pair of lead electrodes arranged next to each other in the lateral direction and forming main portions of a bottom of the recess, and a molded body integrally formed with the pair of lead electrodes and defining sidewalls of the recess; and a light emitting element disposed on at least one of the pair of lead electrodes at the bottom of the recess. The molded body has a reinforcing portion connecting between two sidewalls of the recess opposite to each other in a longitudinal direction. The reinforcing portion is made of two end portions respectively connected to the two lateral sidewalls, and an intermediate portion provided between the two end portions. A height of the two end portions is higher than a height of the intermediate portion. The height of the intermediate portion is higher than surfaces of the pair of lead electrodes at the bottom of the recess and lower than a height of an upper surface of the light emitting element.

The package of the light emitting device according to certain embodiments of the present disclosure has a structure less likely to affect the light distribution of the light emitting device and with which deformation can be reduced. Thus, a light emitting device having good light distribution characteristics and high reliability can be obtained.

DETAILED DESCRIPTION OF EMBODIMENTS

Figure 1A:
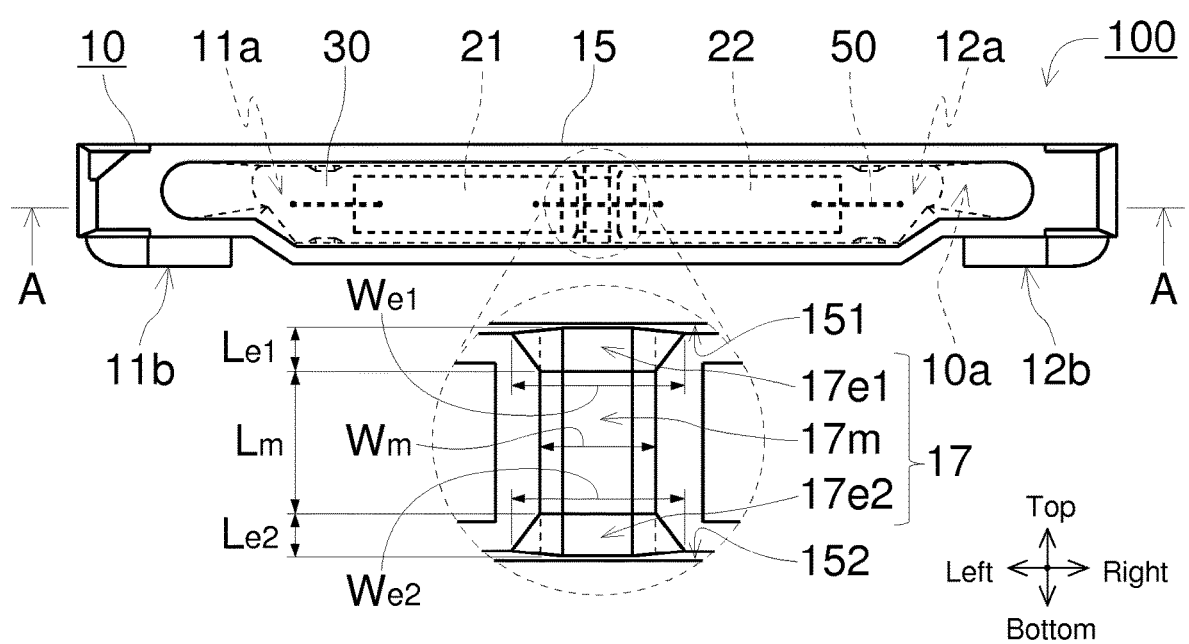
FIG. 1A is a schematic front view of a light emitting device according to one embodiment of the present invention.

Next, certain embodiments of the present disclosure will be described below with reference to the drawings. The light emitting device described below is intended as illustrative to give a concrete form to technical ideas of the present invention, and the scope of the present invention is not limited to those described below unless otherwise specified. Further, the contents described in one embodiment can be also applicable to other embodiment. Further, the size, positional relationship and the like of the constituent elements shown in the drawings may be exaggerated for the sake of clarity.

In the description below, the wavelength range of visible light is 380 nm to 780 nm, the wavelength range of blue light is 420 nm to 480 nm, the wavelength range of green to yellow light is 500 nm to 590 nm, and the wavelength range of red light is 610 nm to 750 nm.

First Embodiment

Figure 1B:
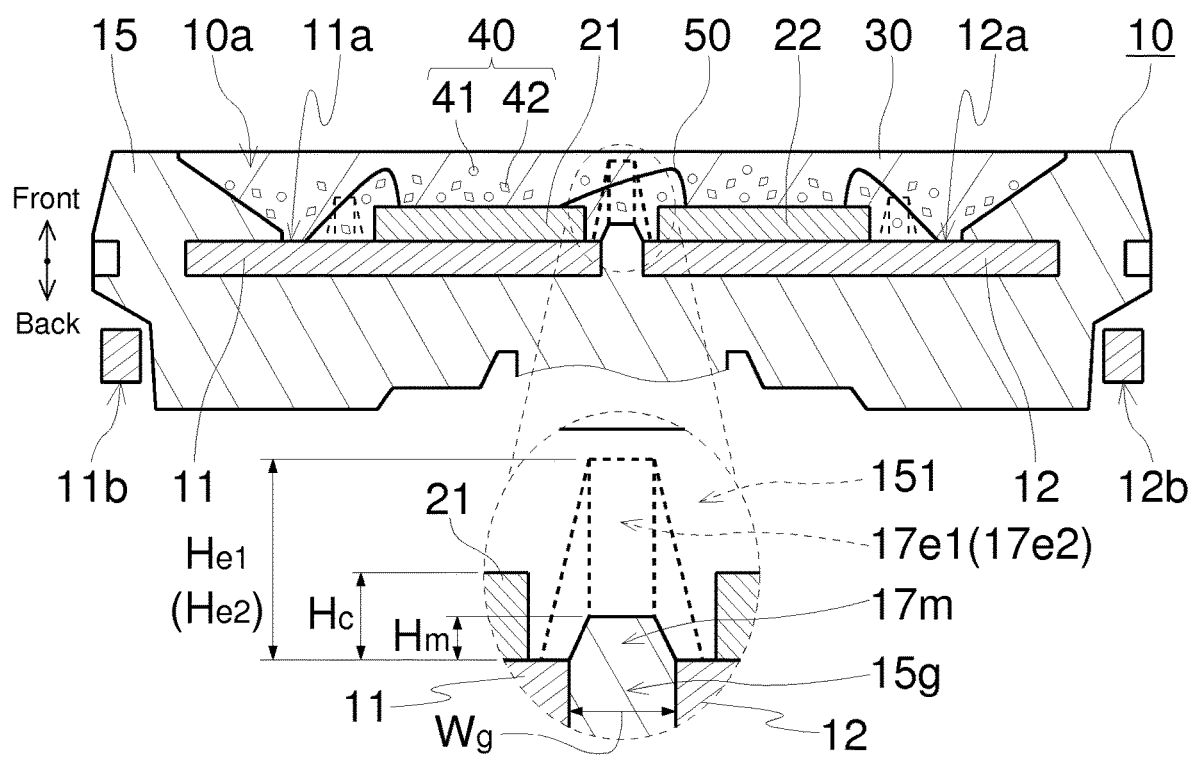
FIG. 1B is a schematic cross-sectional view of the light emitting device taken along line A-A in FIG. 1A.
Figure 1C:
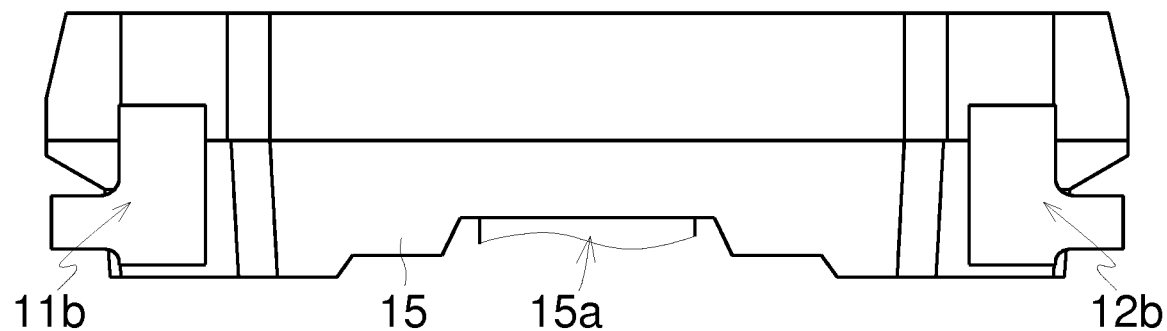
FIG. 1C is a schematic bottom view of the light emitting device according to the embodiment of the present invention.

FIG. 1A is a schematic front view and FIG. 1C is a schematic bottom view of a light emitting according to a first embodiment, and FIG. 1B is a schematic cross-sectional view taken along line A-A in FIG. 1A.

As shown in FIGS. 1A to 1C, the light emitting device 100 according to the first embodiment includes a package 10 and light emitting elements 21, 22. The light emitting device 100 and the package 10 have laterally elongated shapes (that is, elongated in the right-left direction in the drawings). The package 10 defines a recess. The recess is formed to be elongated in the lateral direction similar to the package 10 having a laterally elongated shape. The package 10 includes a pair of lead electrodes 11, 12, and a molded body 15 integrally molded with the pair of lead electrodes 11, 12. The pair of lead electrodes 11, 12 are arranged next to each other in the lateral direction. The pair of lead electrodes 11, 12 form main portions of the bottom of the recess 10a. The molded body 15 structures the sidewalls of the recess 10a. The light emitting elements 21, 22 are accommodated in the recess 10a. More specifically, the two light emitting elements 21, 22 are respectively disposed on the pair of lead electrodes 11, 12 at the bottom of the recess 10a. The light emitting elements 21, 22 are electrically connected to the pair of lead electrodes 11, 12, respectively. Note that, a single light emitting element may be arranged on at least one of the pair of lead electrodes 11, 12 that are arranged at the bottom of the recess 10a.

More specifically, the light emitting device 100 is a light emitting diode (LED). The recess 10a is formed in one side surface that is the front surface of the package 10. The molded body 15 contains white pigment and filler, and exhibits light reflectivity particularly due to the white pigment. Accordingly, the shape of the light emitting region of the light emitting device 100 (unintended leaked light is not taken into consideration) substantially corresponds to the shape of the opening of the recess 10a at the front surface. The pair of lead electrodes 11, 12 according to the first embodiment is substantially symmetric with reference to the center in the lateral direction of the light emitting device 100 (i.e., the package 10). The bottom surface in the recess 10a is formed with a portion of the surface of the molded body 15 and the surfaces of the pair of lead electrodes 11, 12. These portions of the pair of lead electrodes 11, 12 that form the bottom surface of the recess 10a serves for element mounting portions 11a, 12a that include the bonding region of the light emitting elements 21, 22 and/or the connection region of wires 50. Further, the pair of lead electrodes 11, 12 have external connection terminal portions 11b, 12b as the portions located outside the molded body 15. The external connection terminal portions 11b, 12b are bent along the bottom surface of the molded body 15. The light emitting device 100 is mounted by the external connection terminal portions 11b, 12b being soldered to the circuit board and the like. Hence, the mount-side main surface of the light emitting device 100 (the package 10) is the bottom surface. More specifically, the bottom surface of the molded body 15 has a step such that the right and left end portions of the lower surface to dispose the external connection terminals 11b, 12b are elevated with respect to the center portion. Accordingly, the shape of the front of the package 10 (i.e., the molded body 15), and the shape of the opening of the recess 10a are formed such that the center portion is wider downwardly than the right and left portions (that is, to have a greater longitudinal width).

The molded body 15 has a reinforcing portion 17 that connects between two sidewalls 151, 152 opposite to each other in the longitudinal direction of the recess 10a (in the figure, the top-bottom direction). The reinforcing portion 17 is made of two end portions 17e1, 17e2 respectively connected to the two sidewalls 151, 152, and an intermediate portion 17m between the two end portions 17e1, 17e2. Heights He1, He2 of the two end portions are higher than a height Hm of the intermediate portion. The height Hm of the intermediate portion is higher than the surfaces of the pair of lead electrodes 11, 12 at the bottom of the recess 10a and lower than a height Hc of the upper surfaces (front surfaces) of the light emitting elements 21, 22.

The reinforcing portion 17 is formed as described above so that blocking of light of the light emitting elements 21, 22 will be an appropriate degree so as not to significantly affect the light distribution of the light emitting device. Furthermore, the reinforcing portion 17 can effectively enhance the mechanical strength of the molded body 15, so that the degree of deformation can be reduced. Accordingly, the package 10 resistant to deformation caused by external force, change in the temperature due to heat applied in mounting using reflow soldering and/or to heat generated by the light emitting elements 21, 22 and a wavelength converting substance 40 to be described below, and also can facilitate obtaining of desired light distribution can be obtained. Thus, the light emitting device 100 of good light distribution and high reliability can be obtained. Consequently, the quality of the light emitting device having a wide color gamut and emitting light of high quality can be stabilized.

Note that, the reinforcing portion 17 is provided inside the recess 10a, particularly from the bottom of the recess 10a to the sidewalls 151, 152. More specifically, the reinforcing portion 17 is a protruded portion higher than the surfaces of the pair of lead electrodes 11, 12 at the bottom of the recess 10a. Further, the two end portions 17e1, 17e2 are protruded portions protruding inward of the recess 10a with reference to the surfaces of the sidewalls 151, 152. Note that, it is defined that the heights of the portions of the reinforcing portion 17 correspond to the maximum heights, and are each regarded as a perpendicular distance with reference to a plane including the surfaces of the pair of lead electrodes 11, 12 at the bottom of the recess 10a to the highest position in each of the portions. Further, it is defined that the widths of the portions of the reinforcing portion 17 which will be described later correspond to the maximum widths.

In the following, a description will be given of a preferred mode of the light emitting device 100.

As shown in FIGS. 1A and 1B, it is preferable that each of the lateral widths We1, We2 of the two end portions is greater than a lateral width Wm of the intermediate portion. Thus, the molded body 15 (particularly the sidewalls 151, 152) can be easily reinforced by the two end portions 17e1, 17e2, and deformation of the molded body 15 can be easily reduced. Further, at the time of forming the molded body 15, the liquid material of the molded body 15 easily flows inside the mold assembly, so that the moldability of the molded body 15 can be improved. Of the two end portions 17e1, 17e2, portions having greater widths in the lateral direction than that of the intermediate portion 17m may protrude in a direction at right angles relative to the intermediate portion 17m, but those portions preferably protrude at an angle from the intermediate portion 17m to the respective sidewalls 151, 152, that is, preferably formed gradually wider toward the respective sidewalls 151, 152.

As shown in FIG. 1A, it is preferable that each of the longitudinal widths Le1, Le2 of the two end portions is smaller than a longitudinal width Lm of the intermediate portion. Thus, with the end portions 17e1, 17e2 that have greater height than the intermediate portion 17m having longitudinal widths Le1, Le2 smaller than the lateral width Lm of the intermediate portion, blocking of light from the light emitting elements 21, 22 by the end portions 17e1, 17e2 can be appropriately reduced.

As shown in FIGS. 1A and 1B, the surfaces of the two end portions 17e1, 17e2 are preferably made of inclined surfaces inclining relative to the surfaces of the pair of lead electrodes 11, 12 at the bottom of the recess 10a. With this arrangement, the size of the end portions 17e1, 17e2 can be easily reduced, so that blocking of light from the light emitting elements 21, 22 by the end portions 17e1, 17e2 can be appropriately reduced. The surfaces of the two end portions 17e1, 17e2 according to the first embodiment are respectively formed with a plurality of inclined surfaces inclining relative to the surfaces of the pair of lead electrodes 11, 12 at the bottom of the recess 10a.

As shown in FIGS. 1A and 1B, the heights He1, He2 of the two end portions are preferably respectively equal to or greater than the height Hc of the upper surfaces (front surfaces) of the light emitting elements 21, 22, and more preferably greater than Hc. With this arrangement, the molded body 15 (particularly the sidewalls 151, 152) can be easily reinforced by the two end portions 17e1, 17e2, so that deformation of the molded body 15 can be easily reduced. Further, in FIGS. 1A and 1B, the heights He1, He2 of the two end portions are lower than the height of the front surface of the molded body 15, but the heights He1, He2 to be equal to or smaller than the height of the front surface of the molded body 15, and for example, a height substantially the same as the height of the front surface of the molded body 15 can be employed.

As shown in FIGS. 1A and 1B, the reinforcing portion 17 is preferably provided on a spacing region 15g spacing the pair of lead electrodes 11, 12. Damage such as cracking in the mold body 15 tends to occur in the vicinity of the spacing region 15g, so that reinforcing the portion in the vicinity of the spacing region 15g of the molded body 15 with the reinforcing portion 17 has a large technical significance. For this purpose, the reinforcing portion 17 is generally disposed continues to the spacing region 15g of the molded body 15.

As shown in FIGS. 1A and 1B, the lateral widths We1, We2 of the two end portions are preferably greater than a lateral width Wg of the spacing region 15g. Thus, the two end portions 17e1, 17e2 can cover the pair of lead electrodes 11, 12 at the bottom of the recess 10a, and the pair of lead electrodes 11, 12 can be firmly held by the molded body 15.

As shown in FIGS. 1A and 1B, the lateral width Wm of the intermediate portion 17m is preferably equal to or smaller than the lateral width Wg of the spacing region 15g. Thus, the mounting region for the light emitting elements 21, 22 (including the element mounting portions 11a, 12a) at the bottom of the recess 10a can be widely provided. On the other hand, the lateral width Wm of the intermediate portion 17m may be greater than the lateral width Wg of the spacing region 15g. In this case, the intermediate portion 17m covers the pair of lead electrodes 11, 12 at the bottom of the recess 10a, and the pair of lead electrodes 11, 12 can be firmly held by the molded body 15.

As shown in FIGS. 1A and 1B, the reinforcing portion 17 is preferably positioned at the substantial center in the lateral direction of the recess 10a. Since the region around the center in the lateral direction of the recess 10a is the site prone to suffer from damage such as cracking in the molded body 15 (particularly the sidewalls 151, 152), the technical significance of the reinforcing portion 17 reinforcing the region around the center in the lateral direction of the recess 10a of the molded body 15 is great.

As shown in FIGS. 1A and 1B, the two end portions 17e1, 17e2 are preferably substantially symmetric with reference to the intermediate portion 17m in view of substantially evenly reinforcing the molded body 15, but asymmetric configuration may also be employed. In the case where the two end portions 17e1, 17e2 are asymmetric, for example, the width and/or height of one of the two end portions 17e1, 17e2 may be greater than the other. In more detail, for example, the width and/or height of the end portion 17e1 on the top surface side may be greater than that of the end portion 17e2 on the bottom surface side.

As the longitudinal width of the outer shape of the light emitting device 100 (the package 10) (in case of a light emitting device of the side-surface light emission type, the thickness) is smaller, the sidewalls 151, 152 tend to be thinner. Accordingly, the technical significance of the reinforcing portion 17 reinforcing the molded body 15 is greater. From this viewpoint, the longitudinal width of the outer shape of the molded body 15 is preferably 1 mm or smaller. In particular, the longitudinal width of the outer shape of the molded body 15 is preferably 0.8 mm or smaller; more preferably 0.6 mm or smaller; and further preferably 0.5 mm or smaller. The lower limit value of the longitudinal width of the outer shape of the molded body 15 can be appropriately set to, for example 0.2 mm or greater. Further, the thickness of the thinnest portion of the sidewalls 151, 152 can be for example 0.1 mm or smaller. From the viewpoint of increasing the light emitting region (the opening of the recess 10a), it is preferably 0.08 mm or smaller, and more preferably 0.06 mm or smaller. However, the sidewalls 151, 152 of excessively small thicknesses may result in an increase of leakage of light from the sidewalls 151, 152. Therefore, the lower limit value of the thickness of the thinnest site of the sidewalls 151, 152 is preferably 0.03 mm or greater.

As shown in FIGS. 1A to 1C, the light emitting device 100 is preferably of a side-surface light emission type (side-view type). Normally, when a light emitting device is mounted on a circuit board or the like, (the package of) the light emitting device has its surface opposite to the mount-side main surface suctioned by a suction nozzle (a collet), and placed on the circuit board. At this time, (the package 10 of) the light emitting device 100 of the side-surface light emission type has the recess 10a at one side surface, and has the upper surface suctioned by the suction nozzle. Accordingly, the external force of the suction and the placement is directly applied to the sidewalls 151, 152 (particularly to the sidewall 151 on the upper surface side). Thus, the reinforcing portion 17 reinforcing the sidewalls 151, 152 of (the package 10 of) the light emitting device 100 of the side-surface light emission type has great technical significance. Further, since (the package 10 of) the light emitting device 100 of the side-surface light emission type tends to be formed to be thin (for example, the thickness (the longitudinal width of the outer shape) being 1 mm or smaller) and the sidewalls 151, 152 tend to be thin, the reinforcement is more suitable.

As shown in FIGS. 1A and 1B, the light emitting device 100 includes a sealing member 30. The sealing member 30 is filled in the recess 10a. The sealing member 30 contains a wavelength converting substance 40 to convert the light emitted by the light emitting elements 21, 22 into light of different wavelength. The wavelength converting substance 40 includes a first fluorescent material 41 to emit green to yellow light, and a second fluorescent material 42 to emit red light. In this case, it is suitable that the light emitting elements 21, 22 are the elements to emit blue light. With such a configuration, emission of good color reproducibility or good color rendering can be realized. Meanwhile, the use amount of the wavelength converting substance 40 becomes relatively great, and accordingly heat generation due to Stokes' loss increases. The increase of generation of heat may result in deformation of the molded body 15 and/or the sealing member 30 of the package, to which the configuration of the light emitting device 100 according to the present disclosure can be effective.

Further, the second fluorescent material 42 preferably includes a manganese-activated fluoride fluorescent material. The manganese-activated fluoride fluorescent material can emit light having a narrow full width at half maximum in the red region, but with relatively low light emitting efficiency, so that a large amount is required, and thus, heat generation due to Stokes' loss tends to increase. Accordingly, occurrence of deformation of the molded body 15 and/or the sealing member 30 tends to increase, to which the configuration of the light emitting device 100 according to the present embodiment can particularly be effective.

The base material of the sealing member 30 is preferably silicone-based resin containing a phenyl group. Silicone-based resin is thermosetting resin and exhibits good heat resistance and lightfastness, and inclusion of a phenyl group can further enhance the heat resistance. Since silicone-based resin that contains a phenyl group exhibits a relatively great gas barrier characteristic among silicone-based resins, deterioration due to moisture of the manganese-activated fluoride fluorescent material can be easily reduced. Moreover, deterioration of the pair of lead electrodes 11, 12 and wires 50 to be described below, caused by a corrosive gas such as a sulfur containing gas can also be easily reduced. The fluoride fluorescent material activated with manganese can reduce deterioration due to moisture and heat, so that the fluoride fluorescent material activated with manganese is preferably arranged in the sealing member 30 with a greater amount in the back-side portion than in the front-side portion. That is, the fluoride fluorescent material activated with manganese is arranged with a greater amount in the vicinity of the bottom side of the recess 10a.

As shown in FIGS. 1A and 1B, the light emitting device 100 includes the wires 50 connecting between the pair of lead electrodes 11, 12 and the light emitting elements 21, 22, respectively. The wires 50 are accommodated in the recess 10a, and sealed by the sealing member 30. The wires 50 preferably contain silver to improve the light reflectivity. That is, at least the surfaces of the wires 50 are preferably made of silver or silver alloy and more preferably, the wires 50 are made of silver or silver alloy. Meanwhile, the wires 50 may be distorted by expansion and contraction of the sealing member 30, which may results in breakage of the wires 50. In particular, the wires 50 containing silver which has smaller ductility than gold tend to break as compared to gold wires, but the molded body 15 is formed the degree of expansion and contraction of the sealing member 30 is reduced due to the molded body 15 which is less likely to deform, so that breakage of the wires 50 can be reduced. Further, in view of prevention of the breakage, the wires 50 containing silver are preferably gold wires of which surface is coated by silver or silver alloy, or silver alloy wires containing gold. Further, the silver alloy preferably containing 75% or more silver/15% or more gold, or 85% or more silver/5% or more gold (the balance may be, for example, palladium or the like). The wires 50 are used to connect at least one of the pair of lead electrodes 11, 12 and the light emitting elements 21, 22 respectively.

As shown in FIGS. 1B and 1C, the molded body 15 has a gate mark 15a at a back side of the molded body 15 that covers the back surfaces of the pair of lead electrodes 11, 12. In particular, the back side of the molded body 15 covers the entire back surfaces of the portions of the pair of lead electrodes 11, 12 positioned inside the molded body 15. Such a molded body 15 is mainly formed by using injection molding. In injection molding, a resin having a relatively high melt-viscosity may be forcibly injected into the cavity of the mold assembly from a gate. Accordingly, by the pressure of resin, the front surfaces of the pair of lead electrodes 11, 12, particularly the element mounting portions 11a, 12a are pressed against the mold assembly. Thus, generation of burr on the element mounting portions 11a, 12a can be reduced. Further, as described above, the molded body 15 covers the back surfaces and portions of the front surfaces of the pair of the lead electrodes 11, 12, so that the pair of lead electrodes 11, 12 can be firmly held by the molded body 15. For example, thermoplastic resin and unsaturated polyester-based resin are relatively difficult to obtain satisfactory adhesion to the lead electrode, so that such a structure of the molded body 15 is suitable. A gate mark is a protrusion on the molded body and is a remnant of the gate provided as the injection port of resin into the cavity of the mold assembly. Also, a front portion of the molded body 15 mainly forms the sidewalls defining the recess 10a.

Second Embodiment

Figure 2A:
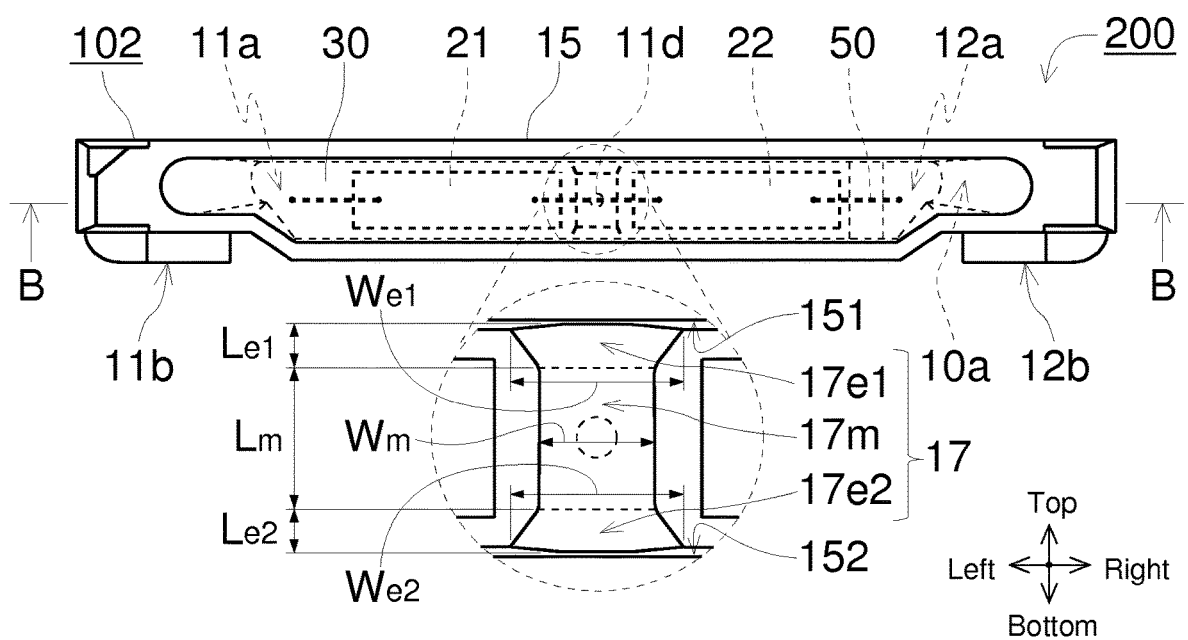
FIG. 2A is a schematic front view of a light emitting device according to another embodiment of the present invention.
Figure 2B:
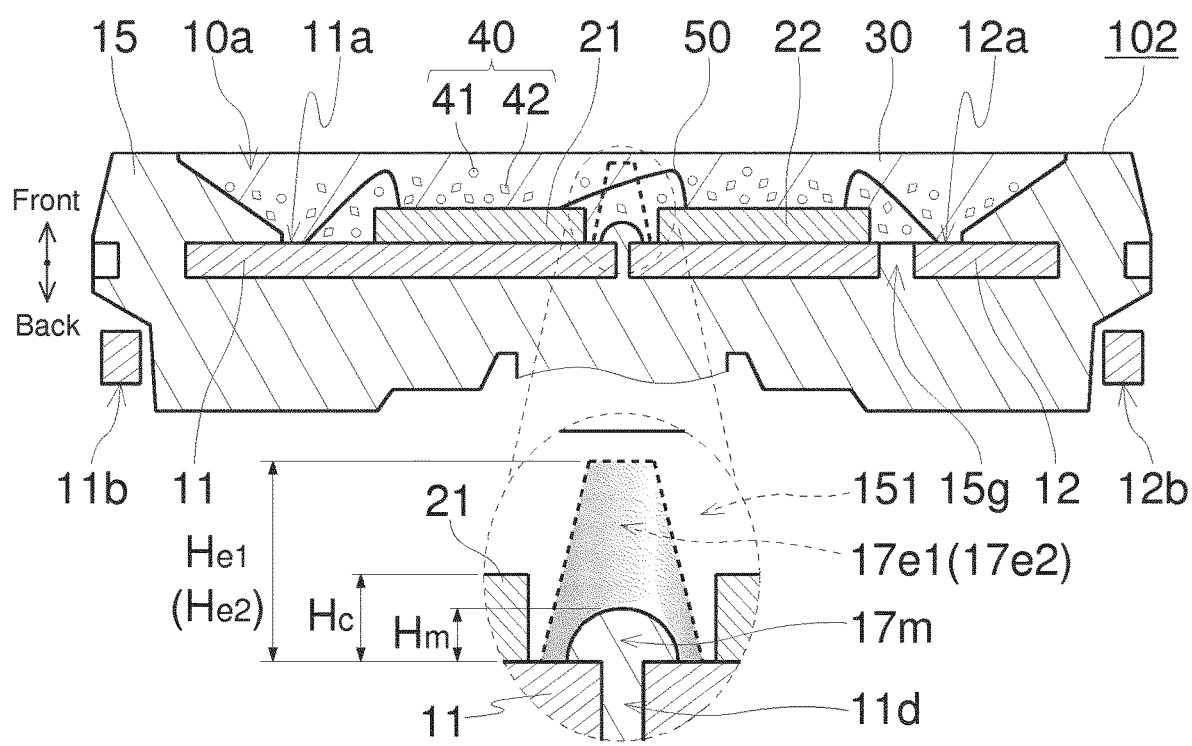
FIG. 2B is a schematic cross-sectional view of the light emitting device taken along line B-B.
Figure 2C:
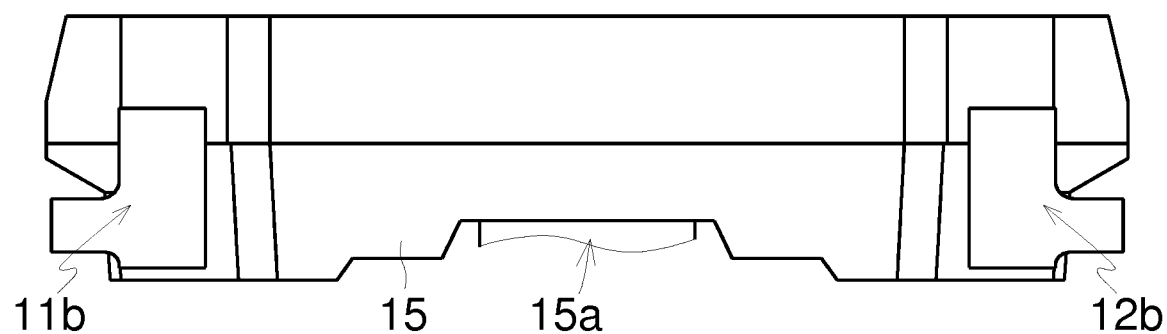
FIG. 2C is a schematic bottom view of the light emitting device according to said another embodiment of the present invention.

FIG. 2A is a schematic front view and FIG. 2C is a schematic bottom view of a light emitting device 200 according to a second embodiment, and FIG. 2B is a schematic cross-sectional view taken along line B-B in FIG. 2A.

As shown in FIGS. 2A to 2C, the light emitting device 200 and a package 102 according to the second embodiment are substantially similar to those of the light emitting device 100 and the package 10 according to the first embodiment except for the shape of the pair of lead electrodes 11, 12, the arrangement of the light emitting elements 21, 22, and the shape of the reinforcing portion 17. Accordingly, the light emitting device 200 and the package 102 described below focusing on the differences from the light emitting device 100 and the package 10, and duplicative descriptions will be omitted.

As shown in FIGS. 2A and 2B, the shapes of the pair of lead electrodes 11, 12 in the light emitting device 200 (package 102) are asymmetric. The first lead electrode 11 is larger than the second lead electrode 12, and in more detail the element mounting part 11a is longer in the lateral direction than the element mounting part 12a of the second lead electrode. The light emitting elements 21, 22 are disposed on the first lead electrode 11 (the element mounting portion 11a), and not on the second lead electrode 12 (the element mounting portion 12a). The surface of the second lead electrode 12 at the bottom of the recess 10a (the element mounting portion 12a) serves for the connection portion of the wires 50.

As shown in FIGS. 2A and 2B, the reinforcing portion 17 in the light emitting device 200 (the package 102) is on the first lead electrode 11, and in more detail, between the two light emitting elements 21, 22 on the first lead electrode 11. The surfaces of the two end portions 17e1, 17e2 and the intermediate portion 17m in the reinforcing portion 17 are formed with curved surfaces.

As shown in FIGS. 2A and 2B, a hole 11d is formed in the first lead electrode 11. The intermediate portion 17m of the reinforcing portion is filled in and placed over the hole 11d. With this arrangement, the first lead electrode 11 can be firmly held by the molded body 15. Further, in view of the mechanical strength and the like of the first lead electrode 11, the dimension of the hole 11d in a front view is preferably such that the entire hole 11d is located inside the reinforcing portion 17, and further preferably the entire hole 11d is located inside the intermediate portion 17m. Further, in similar view, the shape of the opening of the hole 11d I a front view is preferably circular. The hole 11d penetrates from the upper surface of the first lead electrode 11 to the back surface, but it may not penetrate, that is, it may be a recess.

The package 102 as described above also has the structure which is unlikely to affect the light distribution of the light emitting device and also deformation can be reduced. Thus, the light emitting device 200 of good light distribution characteristic and high reliability can be obtained.

In the foregoing, as certain embodiments of the present disclosure, the light emitting device and the package in which the lateral direction is the long-side direction and the longitudinal direction is the short-side direction have been illustrated, but light emitting devices and packaged of other type of configurations such as an approximately square shape, a shape in which lateral direction is a short-side direction and longitudinal direction is a long-side direction may be appropriately employed.

Next, each component of the light emitting device according to certain embodiments of the present disclosure will be described.

Light Emitting Device 100, 200

The light emitting device includes light emitting elements accommodated in a package and respectively electrically connected to a pair of lead electrodes. Further preferably, the light emitting elements are sealed with a sealing member. The light emitting device can be, for example, so-called a "light emitting diode (LED)" or the like. Further, the light emitting device may be of a side-emission type, a top-emission type (a top-view type), or the like.

Package 10, 102

The package is a container for accommodating the light emitting elements and having electrodes (terminals) for supplying electrical power to the light emitting elements from external power source. The package includes at least a pair of lead electrodes and a molded body. The package may be, for example, what is called a "container" or the like. Further, the package may be for a side-surface light emission type light emitting device, for an upper-surface light emission type (top-view type) light emitting device, or the like.

Lead Electrodes 11, 12

The pair of lead electrodes serve as a pair of positive and negative electrodes (terminals) in the package. A single package includes at least one pair of the lead electrodes but may include a plurality of pairs of lead electrodes. The lead electrodes respectively include a base material that may be a plate of copper, aluminum, gold, silver, tungsten, iron, nickel, cobalt, molybdenum, or alloy of the foregoing metals, which may be subjected to various works such as pressing (including punching), etching, rolling and the like. The lead electrodes may be made of a layered body of the foregoing metals or alloy thereof, but a single layer may be employed for the sake of simplicity. In particular, copper alloy whose main component is copper (phosphor bronze, copper-iron alloys and the like) is suitable. Further, a light reflective film of silver, aluminum, rhodium, or alloy of the foregoing metals may be provided on the surface thereof. Of those, silver or silver alloy having good light reflectivity is preferable. In particular, a film (for example, a plating film) of silver or silver alloy using a sulfur-based brightener has a smooth surface, and attains extremely high light reflectivity. The sulfur and/or sulfur compound in the brightener may be scattered in crystal grain and/or crystal grain boundary of silver or silver alloy (the content of sulfur may be, for example, in a range of 50 ppm to 300 ppm). An appropriate degree of glossiness of the light reflective film can be employed which may be preferably 1.5 or greater, and more preferably 1.8 or greater. In the present specification, the degree of glossiness is determined as a value obtained by measurement using a digital densitometer Model 144 available from GAM (Graphic Arts Manufacturing) Company. The lead electrodes of an appropriate thickness can be employed, which may be in a range of 0.05 mm to 1 mm, preferably in a range of 0.07 mm to 0.3 mm, and more preferably in a range of 0.1 mm to 0.2 mm. The lead electrodes may each be a small piece of a lead frame.

Molded Body 15

The molded body serves as the base material of the container portion of the package. The molded body structures part of the outer shape of the package. In view of light reflectivity, the molded body preferably has a light reflectivity of 75% or more in the light emission peak wavelength of the light emitting elements, and more preferably has a light reflectivity of 90% or more. Further, the molded body is preferably white. The molded body transits through a state having flowability before being cured, that is, becomes a liquid-state (including a sol-state and a slurry-state). The molded body can be formed by using an injection molding, a transfer molding and the like.

Base Material of Molded Body

The base material of the molded body may be thermosetting resin or thermoplastic resin. The resins shown below include modified resins and hybrid resins thereof. Thermosetting resin may be epoxy resin, silicone resin, polybismaleimide triazine resin, polyimide resin, polyurethane resin, unsaturated polyester resin and the like. Of those, one of epoxy resin, silicone resin, and unsaturated polyester resin is preferable. In particular, unsaturated polyester-based resin has good heat resistance and lightfastness of thermosetting resin and also can be molded injection molding and is suitable for mass production. Unsaturated polyester-based resin may be at least one of unsaturated polyester resin, modified resin thereof and hybrid resin thereof Specifically, the base material of the molded body may be resins disclosed in JP 2013-153144 A, JP 2014-207304 A, JP 2014-123672 A and the like. Further, thermoplastic resin is also preferable as the base material of the molded body. Generally, thermoplastic resin is low-cost but inferior in heat resistance and lightfastness, and tends to deform when compared to thermosetting resin. However, with the configuration according to the present disclosure, thermoplastic resin can also be preferably used as the base material of the molded body. Specific examples of thermoplastic resin include aliphatic polyamide resin, semiaromatic polyamide resin, aromatic polyphthalamide resin, polycyclohexylene dimethylene terephthalate, polyethylene terephthalate, polycyclohexane terephthalate, liquid crystal polymer, polycarbonate resin, syndiotactic polystyrene, polyphenylene ether, olyphenylenesulfide, polyethersulfone resin, polyetherketone resin, and polyarylate resin. Of those, one of aromatic polyphthalamide resin, aliphatic polyamide resin, polycyclohexane terephthalate, and polycyclohexylene dimethylene terephthalate can be preferably used. Further, in view of light reflectivity, mechanical strength, thermal expansion/contraction and the like, the molded body preferably contains white pigment and filler described below in the base material.

White Pigment

Specific examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. Such white pigments may be used singly or as combination of two or more of these. Of those, titanium oxide is preferable because of its relatively high index of refraction and its good light shielding characteristic. The white pigment of an appropriate shape can be used, which may be of irregular shape (crushed shape), but in view of flowability, spherical shape is preferable. The white pigment of an appropriate particle size (hereinafter the term "particle size" refers to an average particle size D50) can be used, which may be in a range of 0.01 µm to 1 µm, and preferably in a range of 0.1 µm to 0.5 µm. The amount of the white pigment contained in the molded body can be appropriately set, and in view of light reflectivity of the molded body, a greater content is preferable, and further in view of flowability, the content is preferably in a range of 20 wt % to 70 wt %, and more preferably in a range of 30 wt % to 60 wt %. The designation "wt %" indicates the weight percent of the component materials to the total weight of the composition materials.

Filler of Molded Body

Specific examples of the filler include silica, aluminum oxide, glass, potassium titanate, calcium silicate (wollastonite), mica, and talc. Such filler may be used singly or as combination of two or more of these. In the present specification, the filler is different from the above-described white pigment. In particular, as an agent for reducing the coefficient of thermal expansion of the molded body, silica is preferable (the particle size of silica may be, for example, in a range of 5 µm to 100 µm, preferably in a range of 5 µm to 30 µm). Specific examples of preferable reinforcing agent include glass, potassium titanate, and calcium silicate (wollastonite). Of those, calcium silicate (wollastonite) or potassium titanate is relatively small in diameter, and is suitable for a thin-type or a compact molded body. The reinforcing agent of an appropriate average fiber diameter can be used, and for example an average fiber diameter in a range of 0.05 µm to 100 µm, preferably in a range of 0.1 µm to 50 µm, more preferably in a range of 1 µm to 30 µm, and further preferably in a range of 2 µm to 15 µm can be employed. The reinforcing agent of an appropriate average fiber length can be used, and for example an average fiber length in a range of 0.1 µm to 1 mm, preferably in a range of 1 µm to 200 µm, more preferably in a range of 3 µm to 100 µm, and further preferably in a range of 5 µm to 50 µm can be employed. The reinforcing agent of an appropriate average aspect ratio (i.e., average fiber length/average fiber diameter) can be used, and for example, an average aspect ratio in a range of 2 to 300, preferably in a range of 2 to 100 more preferably in a range of 3 to 50, and further preferably in a range of 5 to 30 can be employed. The filler of an appropriate shape can be used, and for example, irregular shape (crushed shape) may be employed, but in view of function as an reinforcing agent, a fiberous shape (needle-shaped) or a planar shape (scale-like shape) is preferable, and in view of flowability, a spherical shape is preferably employed. The amount of the filler contained in the molded body can be appropriately set according to the coefficient of thermal expansion, mechanical strength and the like of the molded body, which is preferably in a range of 10 wt % to 80 wt %, and more preferably in a range of 30 wt % to 60 wt % (in the content of the filler, the content of the reinforcing agent is preferably in a range of 5 wt % to 30 wt %, and more preferably in a range of 5 wt % to 20 wt %).

Light Emitting Elements 21, 22

For the light emitting elements, semiconductor light emitting elements such as LED elements can be used. In many cases, such light emitting elements include a substrate, but the light emitting elements at least include an element structure made of various semiconductor materials, and a pair of positive and negative (pn) electrodes. In particular, a light emitting element of a nitride semiconductor ($In_xAl_yGa_{1-x-y}N$, $0 \leq x$, $0 \leq y$, $x+y \leq 1$) configured to emit light in a range of ultraviolet to visible light is preferable. The light emitting elements preferably have a peak emission wavelength in a range of 445 nm to 465 nm, in view of light emission efficiency, color-mixing relationship with light from other light source, excitation efficiency of the wavelength converting substance and the like. Also, a light emitting element of a gallium arsenic-based semiconductor, a gallium phosphorus-based semiconductor, or the like, configured to emit light in a range of green to red range may be employed. In the case of a light emitting element having a pair of positive and negative electrodes disposed on the same surface side, the electrodes are connected to a pair of lead electrodes via wires (i.e., in face-up mounting), respectively. Alternatively, the electrodes may be connected to the pair of lead electrodes via an electrically conductive adhesive agent (i.e., in flip-chip mounting (face-down mounting)). In the case of a light emitting element having a pair of positive and negative electrodes respectively provided on the opposite surfaces, the electrode on the lower surface is bonded to one lead electrode with an electrically conductive adhesive agent, and the electrode on the upper surface is connected to the other lead electrode via a wire. The number of the light emitting element(s) mounted in one package may be one or two or more. A plurality of light emitting elements can be connected in series or in parallel by wires. Further, three light emitting elements respectively configured to emit light of blue, green, and red light may be mounted in one package.

Sealing Member 30

The sealing member is to seal and protect the light emitting elements from dust, moisture, external force and the like. The sealing member is electrically insulating and is transmissive to light emitted from the light emitting elements (preferably, light transmissivity of 70% or greater, more preferably 85% or greater to light of peak emission peak wavelength of the light emitting elements). The sealing member includes a base material as described below. The base material preferably contains a wavelength converting substance.

Base Material of Sealing Member

Specific examples of the base material of the sealing member include silicone resin, epoxy resin, phenol resin, polycarbonate resin, acrylic resin, TPX resin, polynorbornene resin, or modified resin thereof or hybrid resin thereof. In particular, silicone-based resin including a phenyl group may be at least one of methyl phenyl silicone resin, diphenyl silicone resin, modified resin thereof and hybrid resin thereof. The content of the phenyl group in all the organic groups coupled to silicon atoms in the silicone-based resin containing aphenyl group can be, for example, in a range of 5 mol % to 80 mol %, preferably in a range of 20 mol % to 70 mol %, and more preferably in a range of 30 mol % to 60 mol %.

Wavelength converting Substance 40

The wavelength converting substance absorbs at least part of primary light emitted from the light emitting elements, and emits secondary light having different wavelength than that of the primary light. Accordingly, the light emitting device that can emit mixed-color light (for example, white light) of the primary light of visible wavelength and the secondary light of visible wavelength can be obtained. For the wavelength converting substance, these substances shown below as specific examples may be used singly or as combination of two or more of these.

(First Fluorescent Material 41)

The first fluorescent material can emit green to yellow light. In view of light emission efficiency, color-mixing with light from other light source, and the like, peak light emission wavelength of the first fluorescent material is preferably in the green region (in a range of 500 nm to 560 nm), and more preferably in a range of 520 nm to 560 nm. Specific examples of the first fluorescent material include a yttrium-aluminum-garnet-based fluorescent material (for example, $Y_3(Al,Ga)_5O_{12}$:Ce), a lutetium-aluminum-garnet-based fluorescent material (for example $Lu_3(Al,Ga)_5O_{12}$:Ce), a silicate-based fluorescent material (for example $(Ba,Sr)_2SiO_4$:Eu), a chlorosilicate-based fluorescent material (for example $Ca_8Mg(SiO_4)_4Cl_2$:Eu), and a β-sialon-based fluorescent material (for example $Si_{6-z}Al_zO_zN_{8-z}$:Eu (0<Z<4.2)).

Second Fluorescent Material 42

The second fluorescent material can emit red light. In view of light emission efficiency, color-mixing with light from other light source, and the like, peak light emission wavelength of the second fluorescent material is preferably in a range of 620 nm to 670 nm. Specific examples of the second fluorescent material include a nitrogen-containing calcium aluminosilicate (CASN or SCASN)-based fluorescent material (for example (Sr,Ca) $AlSiN_3$:Eu). Further, a manganese-activated fluoride fluorescent material can be represented by the general formula (I) $A_2[M_{1-a}Mn_aF_6]$ (in the general formula (I), A is at least one selected from the group consisting of K, Li, Na, Rb, Cs and $NH_4$, M is at least an element selected from the group consisting of Group 4 elements and Group 14 elements, and a satisfies 0<a<0.2). Typical examples of such fluoride fluorescent materials include a potassium fluosilicate-based fluorescent material (for example, $K_2SiF_6$:Mn).

In addition, the wavelength converting substance may include quantum dots. The quantum dots are particles having the particle size in a range of about 1 nm to about 100 nm, whose emission wavelength can be changed according to the particle size. Specific examples of the quantum dots include cadmium selenide, cadmium telluride, zinc sulfide, cadmium sulfide, lead sulfide, lead selenide, and mercury cadmium telluride.

Filler of Sealing Member

The filler of the sealing member may be silica, aluminum oxide, zirconium oxide, zinc oxide and the like. Such fillers of the sealing member may be used singly or as combination of two or more of these. In particular, for the agent for reducing the coefficient of thermal expansion in the sealing member, silica is preferable. The filler of an appropriate shape can be used, which may be of irregular shape (crushed shape), but in view of flowability, spherical shape is preferable The amount of the filler contained in the sealing member can be appropriately set according to the coefficient of thermal expansion, flowability and the like of the sealing member, but it is preferably in a range of 0.1 wt % to 50 wt %, and more preferably in a range of 1 wt % to 30 wt %. Further, with the use of nanoparticles (e.g., particles size in a range of 1 nm to 100 nm) as the filler of the sealing member scattering of light (including Rayleigh scattering) of short wavelength such as blue light of the light emitting elements can be increased, which also allows to reduce the amount of the wavelength converting substance. For such nanoparticle filler, for example, silica or zirconium oxide is preferable.

Adhesive Agent

The adhesive agent is a member to bond the light emitting elements to the lead electrodes, and either an electrically insulating adhesive agent or electrically conductive adhesive agent can be used. Examples of the electrically insulating adhesive agent include epoxy resin, silicone resin, polyimide resin, or modified resin thereof or hybrid resin thereof. Examples of the electrically conductive adhesive agent include electrically conductive paste of silver, gold, palladium and the like, tin-bismuth-based, tin-copper-based, tin-silver-based, and gold-tin-based solder.

Wires 50

The wires are electrical conductors of continuous length and provided to connect between the electrodes of the light emitting elements and the lead electrodes, respectively. Specific examples thereof include metal wires of gold, copper, silver, platinum, aluminum, palladium, and alloy of the foregoing metals. The wires of appropriate diameters can be used, which is for example in a range of 5 μm to 50 μm, preferably in a range of 10 μm to 40 μm, and further preferably in a range of 15 μm to 30 μm.

EXAMPLES

Hereinafter, examples according to the embodiments of the present invention will be described in detail. Needless to say, the present invention is not limited only to the examples described below.

Example 1

A light emitting device of Example 1 is a side-surface light emission type LED having the structure of the light emitting device 100 in the example illustrated in FIGS. 1A to 1C. The light emitting device (i.e., the package) has a size of a lateral width (width in the right-left direction as indicated in the figure) of 3.8 mm, a depth (width in the front-back direction) of 0.85 mm, and a thickness (width in the top-bottom direction) of 0.4 mm.

The package 10 is formed by molding a molded body 15 integrally with a first lead electrode 11 (a negative electrode) and a second lead electrode 12 (a positive electrode). The package 10 defines a recess 10a in its front surface. with an opening of a lateral length of 3.3 mm, a longitudinal length of 0.29 mm (the right-left narrow part 0.19 mm), and a depth of 0.3 mm. The molded body 15 contains, in the base material of aliphatic polyamide resin, a white pigment of titanium oxide (30 wt %), and a filler of fibrous calcium silicate (wollastonite; 15 wt %). The molded body 15 is molded byway of injection molding, and has a gate mark 15a substantially at the center of the back surface (of the back-side portion of the mold). The first lead electrode 11 and the second lead electrode 12 are each a metal piece with a thickness of 0.11 mm, which is made of a base material of copper alloy provided with silver plating using a sulfur-based brightener. The molded body 15 defines the sidewalls of the recess 10a and the molded body 15 and the first and lead electrodes 11, 12 define the bottom surface of the recess 10a. The portions of the first lead electrode 11 and the second lead electrode 12 at the bottom of the recess 10a respectively serve as to first element mounting portion 11a and a second element mounting portion 12a. Further, the first lead electrode 11 and the second lead electrode 12 have, as the sites positioned outside the molded body 15, a first external connection terminal part 11*b* and a second external connection terminal part 12*b*. The first external connection terminal part 11*b* and the second external connection terminal part 12*b* are bent so as to extend from the bottom surface of the molded body 15 and along the bottom surface thereof, and further bent along the right/left end surfaces.

The molded body 15 has a reinforcing portion 17 connecting between two sidewalls 151, 152 opposing to each other in the top-bottom direction of the recess 10*a*. The reinforcing portion 17 is made of two end portions 17*e*1, 17*e*2 connected to the two sidewalls 151, 152, respectively, and the intermediate portion 17*m* provided between the two end portions 17*e*1, 17*e*2. The reinforcing portion 17 is on the spacing region 15*g* (having a lateral width Wg of 0.12 mm) spacing the first lead electrode 11 and the second lead electrode 12, and at substantially the center in the lateral direction of the recess 10*a*. The shape of the intermediate portion 17*m* as seen from the front surface side is quadrangular (bold linear), and the cross-sectional shape of the intermediate portion 17*m* is trapezoidal (the inclination angle of the side surface (the interior angle) is 79° with reference to the plane including the surfaces of the lead electrodes at the bottom of the recess 10*a*). The longitudinal width Lm of the intermediate portion is 0.145 mm. The lateral width Wm of the intermediate portion is 0.11 mm. The height Hm of the intermediate portion is 0.1 mm. Each of the surfaces of the two end portions 17*e*1, 17*e*2 is structured by three inclined surfaces each having an inclination angle (the interior angle with reference to the plane including the surfaces of the lead electrodes at the bottom of the recess 10*a*) is about 64°. The two end portions 17*e*1, 17*e*2 have their widths increased in the lateral direction each by an angle of 15° from the intermediate portion 17*m* toward the sidewalls. The longitudinal widths Le1, Le2 of the two end portions are each 0.055 mm. The lateral widths We1, We2 of the two end portions are each 0.14 mm. The heights He1, He2 of the two end portions are each 0.25 mm. Note that, the inclination angle of each of the sidewalls 151, 152 (the interior angle with reference to the plane including the surfaces of the lead electrodes at the bottom of the recess 10*a*) is 85°.

In the recess 10*a* of the package, two light emitting elements 21, 22 are stored. These light emitting elements 21, 22 are each an approximately rectangular parallelepiped-shaped LED chip in which an n-type layer, an active layer, and a p-type layer of a nitride semiconductor are successively stacked on a sapphire substrate, capable of emitting blue-color light (the light emission peak wavelength is about 455 nm) and having a longitudinal length of 0.18 mm, a lateral length of 0.8 mm, and a thickness of 0.12 mm (substantially corresponds to Hc). The two light emitting elements 21, 22 are respectively bonded on the first element mounting part 11*a* and the second element mounting part 12 with an adhesive agent. Between the n-electrode of the first light emitting element 21 and the first element mounting part 11*a*, between the p-electrode of the first light emitting element 21 and the n-electrode of the second light emitting element 22, and between the p-electrode of the second light emitting element 22 and the second element mounting part 12*a* are connected by the wires 50. The adhesive agent is dimethyl silicone resin. The wires 50 are silver-gold alloy wires (about 80% silver/about 20% gold) having a diameter of 25 μm.

Inside the recess 10*a* of the package, a sealing member 30 is filled covering the light emitting elements 21, 22. The sealing member 30 includes a base material made of methyl phenyl silicone resin, which contains a first fluorescent material 41, which is a β-sialon-based fluorescent material to emit green light (of which peak light emission wavelength is about 540 nm), and the wavelength converting substance 40 made of the second fluorescent material 42 being a potassium fluosilicate-based fluorescent material capable of emitting red-color light (of which light emission peak wavelength is about 630 nm). The front surface of the sealing member 30 is on the substantially identical plane as the front surface of the molded body 15 (while being a slight concave surface by cure shrinkage). The wavelength converting substance 40 exists in a greater amount on the bottom surface side of the recess 10*a* in the sealing member 30.

Evaluation

Mechanical strength of the light emitting device of Example 1 is evaluated using an adhesive strength test and a flexural strength test. In the adhesive strength test, the light emitting device is soldered on a circuit board. Then, the center of the back side of the light emitting device is pressed by a jig in parallel to the surface of the board, and the load that beaks the light emitting device is measured. In the flexural strength test, the upper surface side of the light emitting device is placed on a support jig having a gap of 1 mm. Then, the center of the bottom surface of the light emitting device is pressed by a jig in the vertical direction, and the load that breaks the light emitting device is measured. The light emitting device according to Comparative Example 1 is different from the light emitting device according to Example 1 in that the reinforcing portion 17 is replaced by a reinforcing portion in which the two end portions 17*e*1, 17*e*2 are not provided, and the intermediate portion 17*m* is extended to the sidewalls 151, 152. It is found that, from the adhesive strength test and the flexural strength test, the light emitting device according to Example 1 shows an improvement of 2.5% in the mechanical strength as compared to the light emitting device according to Comparative Example 1.

The light emitting device according to one embodiment of the present invention can be used for a backlight apparatus of a liquid crystal display, various illumination devices, various display apparatus such as a large-size display, advertisement, and a destination guide, a projector apparatus, and furthermore, an image reading apparatus such as a digital video camera, facsimile, copier, scanner and the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device of a side-surface light emission type comprising:
   a package defining a recess and having a shape elongated in a lateral direction, the package including a pair of lead electrodes arranged next to each other in the lateral direction and forming main portions of a bottom of the recess, and a molded body integrally formed with the pair of lead electrodes and defining sidewalls of the recess; and
   a light emitting element disposed on at least one of the pair of lead electrodes at the bottom of the recess, wherein:
   the molded body has a spacing portion located between the lead electrodes, and a protruded portion that protrudes from the spacing portion and connects between two sidewalls of the recess that oppose each other in a longitudinal direction, among the sidewalls of the recess, the protruded portion comprises:
   two end portions respectively connected to the two sidewalls of the recess that oppose each other in a longitudinal direction, and
   an intermediate portion provided between the two end portions, the intermediate portion having a trapezoidal cross-sectional shape,
   wherein the intermediate portion comprises an upper surface, and each end portion comprises an inclined upper surface that is continuous with the upper surface of the intermediate portion, and
   wherein, at locations at which the two end portions respectively connect with the intermediate portion, (i) overall lateral widths of the end portions are equal to an overall lateral width of the intermediate portion, (ii) a lateral width of the upper surface of the intermediate portion is smaller than the overall lateral width of the intermediate portion, and (iii) the lateral width of the upper surface of the intermediate portion is equal to lateral widths of the inclined upper surfaces of the end portions,
   a height of the two end portions is higher than a height of the intermediate portion,
   the height of the intermediate portion is higher than surfaces of the pair of lead electrodes at the bottom of the recess and lower than a height of an upper surface of the light emitting element,
   a maximum width of the intermediate portion in the lateral direction is less than or equal to a minimum width of the spacing portion in the lateral direction, and
   the molded body comprises a gate mark, and, in a cross-sectional view of the molded body, the gate mark is located below the intermediate portion of the protruded portion of the molded body.

2. The light emitting device according to claim 1, wherein maximum lateral widths of the two end portions are greater than a maximum lateral width of the intermediate portion.

3. The light emitting device according to claim 1, wherein a longitudinal width of the two end portions is smaller than a longitudinal width of the intermediate portion.

4. The light emitting device according to claim 1, wherein surfaces of the two end portions are respectively structured by inclined surfaces inclined relative to the surfaces of the pair of lead electrodes at the bottom of the recess.

5. The light emitting device according to claim 1, wherein the height of the two end portions is greater than or equal to the height of the upper surface of the light emitting element.

6. The light emitting device according to claim 1, wherein maximum lateral width of the two end portions are greater than a lateral width of the spacing portion.

7. The light emitting device according to claim 1, wherein the protruded portion is provided at a substantial center in the lateral direction of the recess.

8. The light emitting device according to claim 1, wherein a longitudinal width of an outer shape of the molded body is 1 mm or smaller.

9. The light emitting device according to claim 1, wherein a base material of the molded body is thermoplastic resin.

10. The light emitting device according to claim 1, wherein a base material of the molded body is unsaturated polyester-based resin.

11. The light emitting device according to claim 1, further comprising a sealing member filled in the recess, wherein
   the sealing member contains a wavelength converting substance to convert light emitted by the light emitting element into light of different wavelength, and
   the wavelength converting substance contains a first fluorescent material to emit green to yellow light, and a second fluorescent material to emit red light.

12. The light emitting device according to claim 11, wherein the second fluorescent material contains a manganese-activated fluoride fluorescent material.

13. The light emitting device according to claim 11, wherein the base material of the sealing member is silicone-based resin containing a phenyl group.

14. The light emitting device according to claim 2, wherein a longitudinal width of the two end portions is smaller than a longitudinal width of the intermediate portion.

15. The light emitting device according to claim 14, wherein surfaces of the two end portions are respectively structured by inclined surfaces inclined relative to the surfaces of the pair of lead electrodes at the bottom of the recess.

16. The light emitting device according to claim 15, wherein the height of the two end portions is greater than or equal to the height of the upper surface of the light emitting element.

17. The light emitting device according to claim 16, wherein the protruded portion is on a spacing portion that spaces the pair of lead electrodes apart from each other.

18. The light emitting device according to claim 17, wherein the protruded portion is provided at a substantial center in the lateral direction of the recess.

19. The light emitting device according to claim 1, wherein, in the cross-sectional view of the molded body, both ends of the intermediate portion are located inside both ends of the gate mark in the lateral direction.

20. The light emitting device according to claim 1, further comprising at least one pair of protrusions that oppose each other in the longitudinal direction, wherein each protrusion of each pair of opposing protrusions is located on a respective one of the two sidewalls of the recess that oppose each other in the longitudinal direction.

21. The light emitting device according to claim 1, wherein a lateral width of the gate mark is at least three times larger than the overall lateral width of the intermediate portion.

* * * * *

UNITED STATES PATENT AND TRADEMARK OFFICE
CERTIFICATE OF CORRECTION

| | | |
|---|---|---|
| PATENT NO. | : 10,553,568 B2 | Page 1 of 1 |
| APPLICATION NO. | : 15/081359 | |
| DATED | : February 4, 2020 | |
| INVENTOR(S) | : Tetsuya Ishikawa | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 55 days.

Signed and Sealed this
First Day of September, 2020

Andrei Iancu
*Director of the United States Patent and Trademark Office*